United States Patent [19]

Kato et al.

[11] 4,278,893

[45] Jul. 14, 1981

[54] ALIGNMENT APPARATUS

[75] Inventors: Yuzo Kato; Yasuo Ogino; Ryozo Hiraga; Hideki Yoshinari, all of Yokohama; Masao Tozuka, Ohmiya; Ichiro Kano, Yokohama; Akiyoshi Suzuki, Tokyo, all of Japan

[73] Assignee: Canon Kabushiki Kaisha, Tokyo, Japan

[21] Appl. No.: 14,359

[22] Filed: Feb. 23, 1979

[30] Foreign Application Priority Data

Feb. 27, 1978 [JP] Japan ................................ 53-2164

[51] Int. Cl.³ ............................................ G01N 21/86
[52] U.S. Cl. ....................................... 250/548; 356/401
[58] Field of Search ....................... 250/548, 557, 561; 356/399, 400, 401

[56] References Cited

U.S. PATENT DOCUMENTS 4,070,117  1/1978  Johannsmeier et al. ............. 356/401
4,127,777  11/1978  Binder ................................. 250/548

Primary Examiner—David C. Nelms
Attorney, Agent, or Firm—Fitzpatrick, Cella, Harper & Scinto

[57] ABSTRACT

An alignment apparatus by which two points on a first standard line on a first workpiece may be aligned in two regions having as the centers two standard points on a second standard line on a second workpiece optically opposed to the first workpiece and having predetermined areas. The two regions are diamond-shaped. By this, it is possible to reduce the alignment error of the first and second workpieces.

1 Claim, 15 Drawing Figures

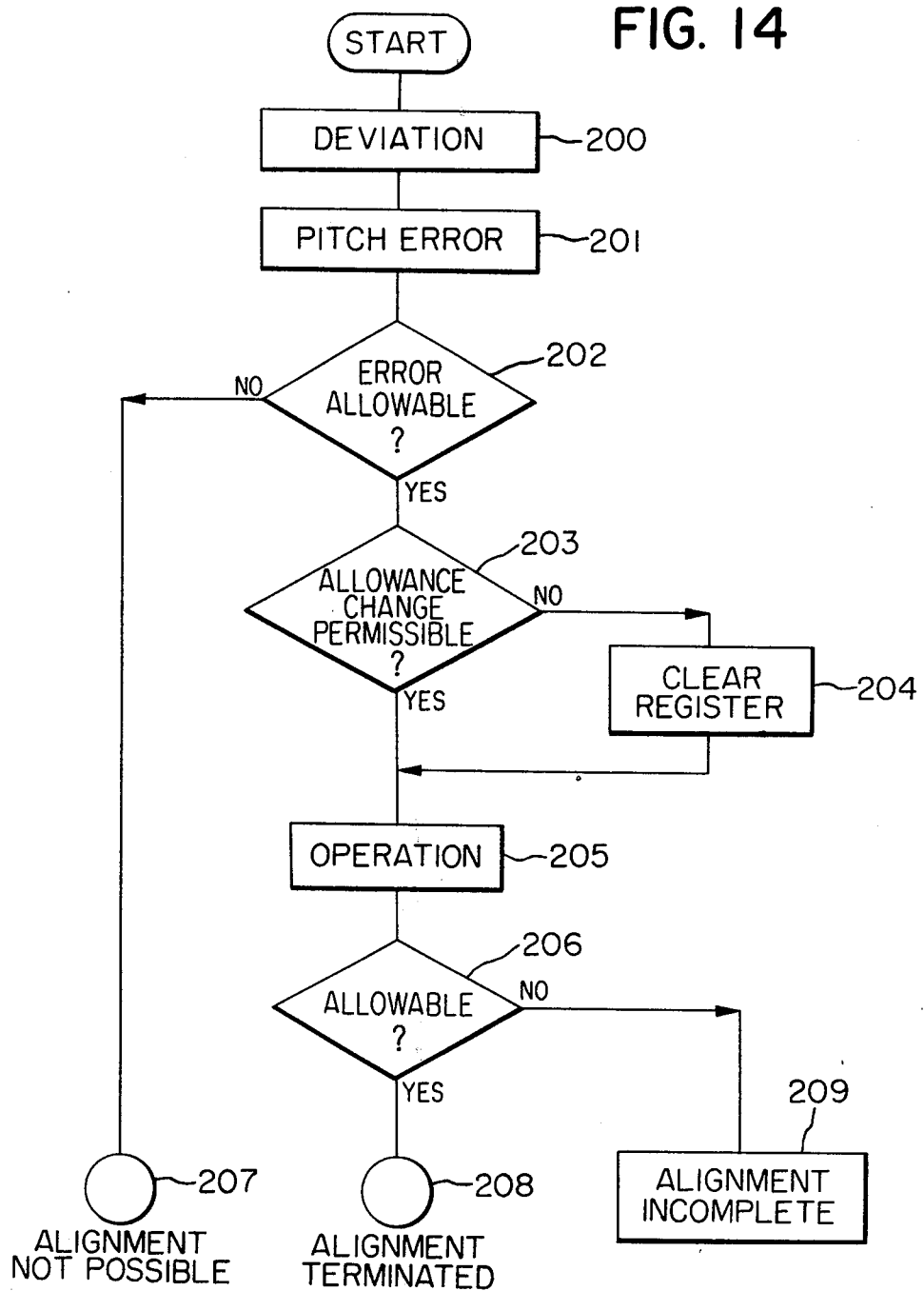

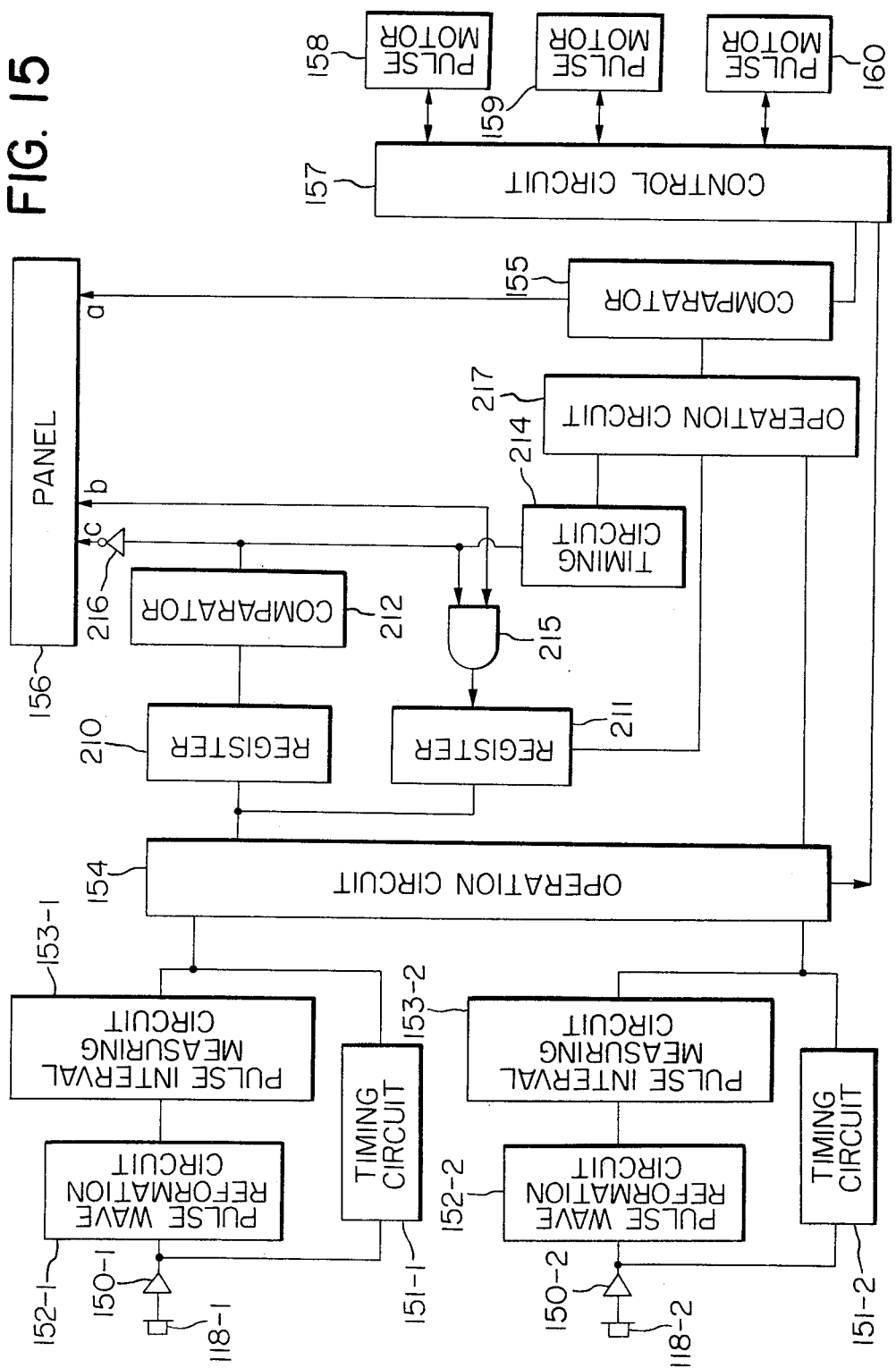

ALIGNMENT APPARATUS

BACKGROUND OF THE INVENTION

1. Field of the Invention

This invention relates to an alignment apparatus, and more particularly to an alignment apparatus whereby, for example, a mask and a wafer for producing a semiconductor circuit element may be aligned at points on the mask and wafer within a predetermined allowable error and with good operability.

2. Description of the Prior Art

Usually, a mask is supported by a fixed mask carrier and a wafer is supported by a wafer carrier which is parallel-movable in the directions x, y and $\theta$ with respect to the mask carrier. The mask and wafer are provided with respective alignment marks and by photoelectrically scanning these alignment marks along a predetermined scanning line, the positional relation between the standard point on the mask and a point on the wafer corresponding to the standard point on the mask is measured and, when the point on the wafer is without the allowable error range relative to the standard point on the mask, the wafer carrier is moved in a plane by driving x, y and $\theta$ motors, thereby effecting the alignment within the aforementioned allowable error range.

Alignment marks are usually provided at two locations on the mask and wafer along a predetermined standard line. The two locations are usually situated at an interval so as to be symmetrical with respect to the centers of the mask and wafer.

Whether or not the alignment between the standard point on the mask and the corresponding point on the wafer is within an allowable error range is discriminated by a circuit for discriminating a relative position signal provided by a photoelectric output. This discrimination circuit usually determines whether or not the corresponding point on the wafer lies within a square whose two sides are parallel to the direction of the standard line having the standard point of the mask as the center or within a circular area.

However, where the area is set to a square whose two sides are parallel to the direction of the standard line or to a circle, it is sometimes the case that a certain point on the mask and wafer, particularly, the vertex position with respect to the direction of arrangement of the alignment marks is not within the allowable error range.

This will be described by reference to FIGS. 1 and 2 of the accompanying drawings.

FIG. 1 illustrates the case where the allowable area is a square. In FIG. 1, the mask 1 and the wafer 2 are shown as being overlapped, and the following description will be made with respect to a case where the mask is fixed and the wafer is movable. Designated by 3 and 4 are standard points provided at the opposite ends of the standard line on the mask 1 (the x-axis having the center of the mask 1 as the origin) and equidistantly with respect to the origin. Designated by 5 and 6 are square allowable regions with the standard points 3 and 4 as the centers and having predetermined areas. Accordingly, points 7 and 8 on the wafer are aligned so as to be positioned within these regions 5 and 6.

Assume that the points 7 and 8 on the wafer are aligned as shown. In this case, the points on a circular circumference having the centers of the mask 1 and wafer 1 as the centers are designated at 9 to 14. That is, 9, 10 and 11 are the points on the circular circumference containing the standard points 3 and 4 on the mask 1 and whereat the angles formed with the x-axis of the mask are 30°, 45° and 90°, respectively, and these points form the standard points at the respective locations. Also, 12, 13 and 14 are the points on the circular circumference containing the points 7 and 8 on the wafer 2 and when the points 7 and 8 on the wafer are completely coincident with the standard points 3 and 4 on the mask 1, these points 12, 13 and 14 are coincident with the points 9, 10 and 11 on the mask 1. However, when the points 5 and 6 on the wafer are made coincident with the standard points 3 and 4 on the mask 1 within the allowable error regions 5 and 6, the points 9, 10 and 11 lie within the regions 15, 16 and 17. Therefore, these regions 15, 16 and 17 are larger than the regions 5 and 6 and accordingly, there is a possibility that the points 12, 13 and 14 are deviated beyond the allowable amount of deviation with respect to the points 9, 10 and 11 on the mask. As a matter of course, the greater the angles, the greater the amount of deviation.

A similar situation occurs when the allowable regions 5 and 6 are in the form of circles centered at points 3 and 4, as shown in FIG. 2.

In order that each point on the mask 1 and the wafer 2 may be aligned in an allowable range, the allowable range may be set in the portion in which the amount of deviation is greatest, namely, in the portion in which said angle is greatest. However, where such method is adopted, the areas of the allowable regions 5 and 6 on the standard axis will become small. This will in turn mean an increased difficulty an aligning work.

SUMMARY OF THE INVENTION

The alignment apparatus of the present invention has been made in view of the above-noted points. It is therefore an object of the present invention to provide an alignment apparatus in which the alignment between each point on the mask and wafer is within an allowable error range and which is good in alignment operability.

Such object may be achieved by setting the allowable error regions of the standard point on the mask and the point on the wafer corresponding to the standard point to the regions defined by substantially straight lines passing through two points presenting the allowable amount of error in the direction of arrangement of the alignment marks and through two points presenting the allowable amount of error in the direction perpendicular to said direction.

More specifically, in the most preferable state, the allowable regions 5 and 6 formed at the opposite ends of the standard axis, namely, x-axis, are determined by the following group of linear formulas:

$$\Delta y + a\Delta x \leq T \quad (1)$$

$$\Delta y + a\Delta x \geq -T \quad (2)$$

$$\Delta y - a\Delta x \leq T \quad (3)$$

$$\Delta y - a\Delta x \geq -T \quad (4)$$

where $\Delta y$ is the amount of deviation in the direction of y-axis perpendicular to the x-axis, $\Delta x$ is the amount of deviation in the direction of the x-axis, and T is a constant having the relation that $1.1 \geq a > 0$ which is the maximum amount of deviation in the direction of the y-axis.

However, in the setting of a region, the region need not be surrounded by a straight line but may be surrounded by a substantially straight line and therefore, it may be set to a region formed by a substantially straight line passing through a point presenting the tolerance amount of deviation in the direction of the x-axis having said standard point as the center and through a point presenting the tolerance amount of deviation in the direction of y-axis.

This will be described by reference to the accompanying drawings.

FIG. 3 refers to the case where a in formulas (1) to (4) is 1. In this case, for the points 9, 10 and 11 on the circular circumference of the standard points 3 and 4 on the mask, the regions 15, 16 and 17 which may be assumed by the points 12, 13 and 14 on the wafer corresponding to these points 9, 10 and 11 are the regions inscribed to a circle 20 having the value of the maximum allowable error as the radius, as shown in FIG. 4, and therefore, the alignment between the mask and the wafer does not exceed the value of the maximum allowable error depending on the locations as shown in FIGS. 1 and 2.

FIG. 5 refers to the case where a in the aforementioned formulas (1) to (4) is 0.5. In this case, the regions 15, 16 and 17 which may be assumed by the points 12, 13 and 14 on the wafer corresponding to the points 9, 10 and 11 on the circular circumference of the mask are entirely identical to the regions 5 and 6. In this case, as a matter of course, the maximum allowable errors in the x and y directions differ from each other. However, at all points, the amount of deviation is within the maximum allowable error and it is therefore advantageous that the maximum allowable errors in the x and y directions differ from each other.

The invention will become more fully apparent from the following detailed description thereof taken in conjunction with the accompanying drawings.

BRIEF DESCRIPTION OF THE DRAWINGS

FIG. 14 is a flow chart relating to an embodiment which covers the pitch error.

FIG. 15 is a block diagram of the electric processing unit relating to an embodiment which covers the pitch error.

DESCRIPTION OF THE PREFERRED EMBODIMENTS

Figure 1:
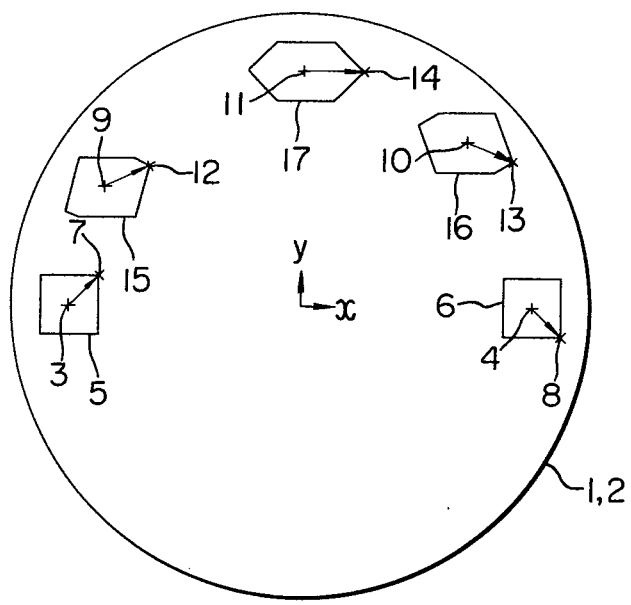
FIGS. 1 and 2 illustrate the conventional method of alignment between a mask and a wafer.
Figure 2:
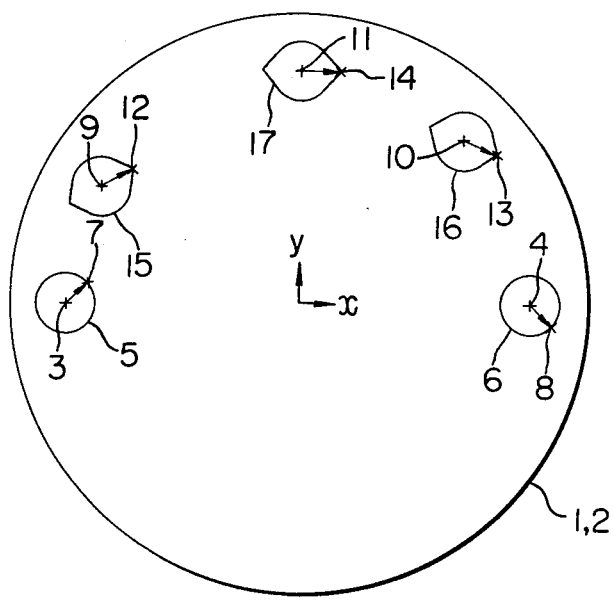
Figure 3:
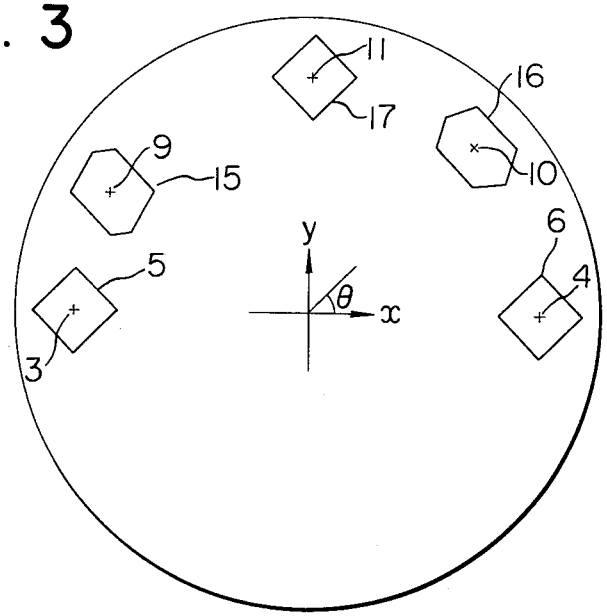
FIG. 3 illustrates the alignment method of the present invention.
Figure 4:
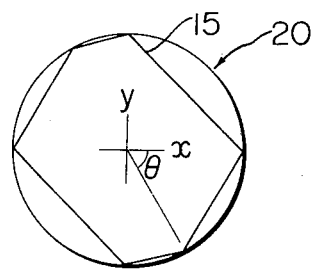
FIG. 4 illustrates the amount of deviation in the region 15 of FIG. 3.
Figure 5:
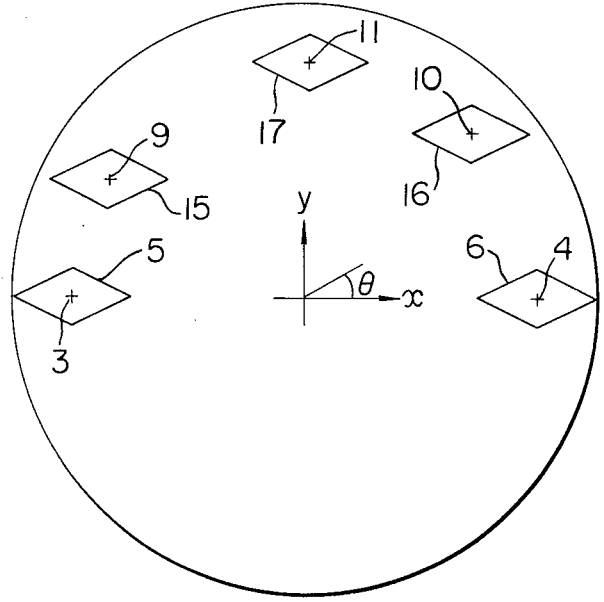
FIG. 5 illustrates the alignment method of the present invention which differs from that of FIG. 3.
Figure 6:
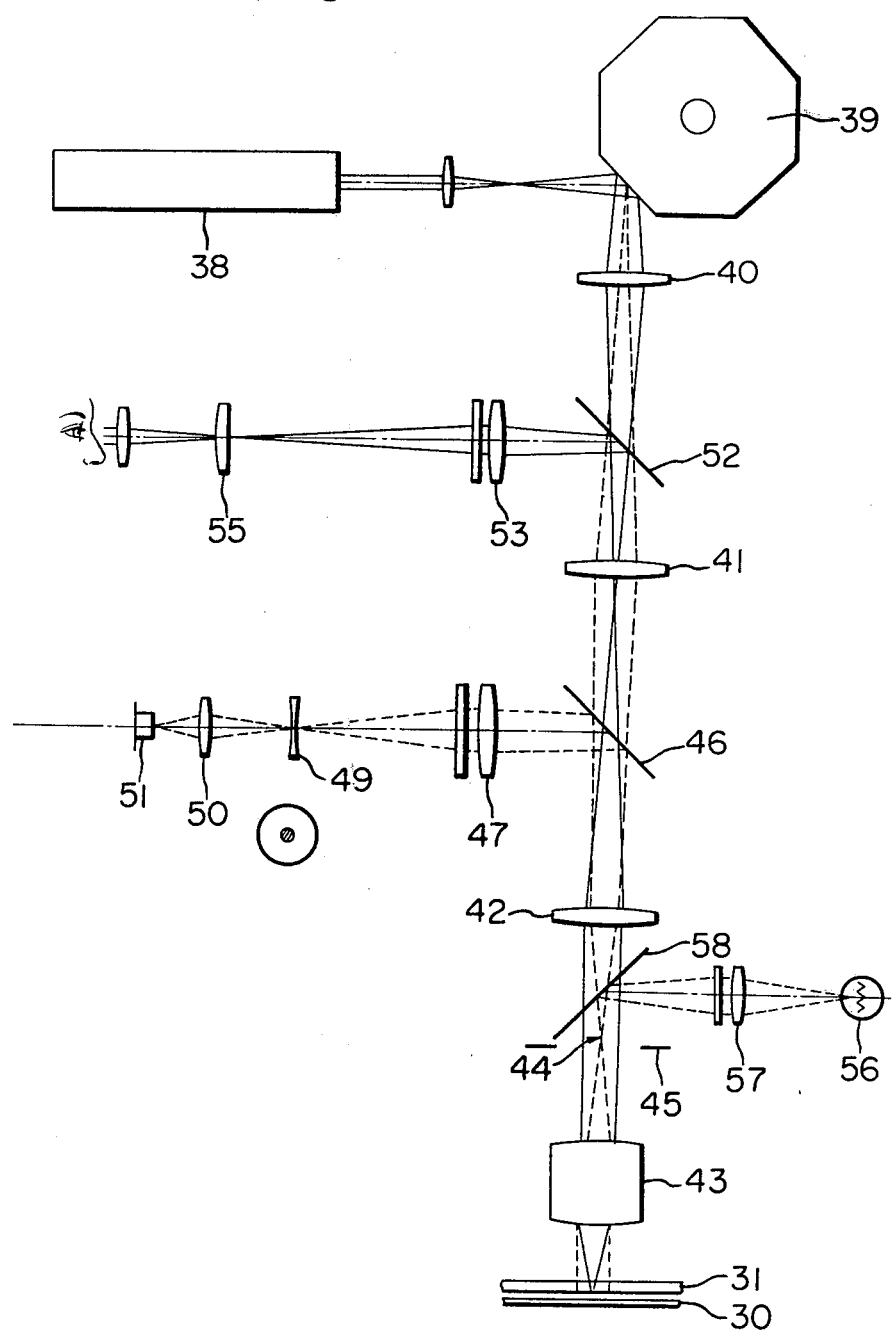
FIG. 6 illustrates the principle of an optical system for scanning by a spot light and for providing a scanning signal.

Referring to FIG. 6, it shows the photoelectric detection scanning optical system of the alignment apparatus of the present invention. The optical system is similar to that disclosed in U.S. Pat. No. 4,199,219.

Figure 10:
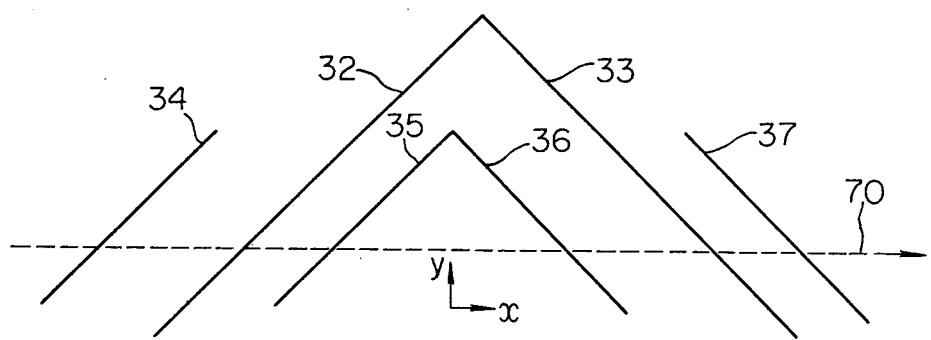
FIG. 10 is a view showing the alignment marks on the mask and wafer.

Designated by 30 is a wafer supported by a wafer carrier which is parallel-movable in the directions x, y and $\theta$ by pulse motors. Denoted by 31 is a mask supported by a fixed mask carrier. Provided on the wafer 30 are alignment marks formed by inclined surfaces as indicated by 32 and 33 in FIG. 10. These alignment marks represent the reference points of the wafer. Provided on the mask 31 are alignment marks formed by inclined surfaces as indicated by 34, 35, 36 and 37 in FIG. 10. These alignment marks represent the standard points of the mask.

Turning back to FIG. 6, reference numeral 38 designates a laser source which is non-photosensitizing to the wafer 30, reference numeral 39 denotes a rotatable polygon mirror, reference numerals 40, 41 and 42 designate intermediate lenses, and reference numeral 43 denotes a telecentric objective lens. The intermediate lenses 40, 41 and 42 collimate the deflected light from the rotatable polygon mirror 39 and form the origin of deflection 44 (i.e. the origin of deviation) of the deflected light at the diaphragm position 45 of the objective lens 43. Thus, spot light scanning is effected on the mask and wafer 31 and 30.

Designated by 46 is a beam splitter. A photoelectric detecting system is formed by this beam splitter 46. Denoted by 47 is a lens which cooperates with the lens 42 to re-form the image of the origin of deviation 44. Reference numeral 49 denotes a space filter disposed on the surface on which the re-formed image is formed. This space filter 49 has a light-intercepting portion which is of the same size as the image of the origin of deviation. Therefore, the filter 49 intercepts the reflected light from the surface perpendicular to the optic axis of the objective lens 43 and passes the reflected light from the inclined surface.

Accordingly, it passes the light from the alignment marks. Designated by 50 is a condenser lens, and 51 a photodetector. An alignment mark scanning signal is provided by this photodetector with the movement of the spot.

Designated by 52 is a beam splitter. An observation system is formed by this beam splitter 52. A lens 53 cooperates with the lenses 43, 42 and 41 to form the images of the mask and wafer 31 and 30 on a field lens 55. Denoted by 56 is a light source for illuminating the mask and wafer 31 and 30. Designated by 57 is a lens, and 58 a beam splitter.

Figure 8:
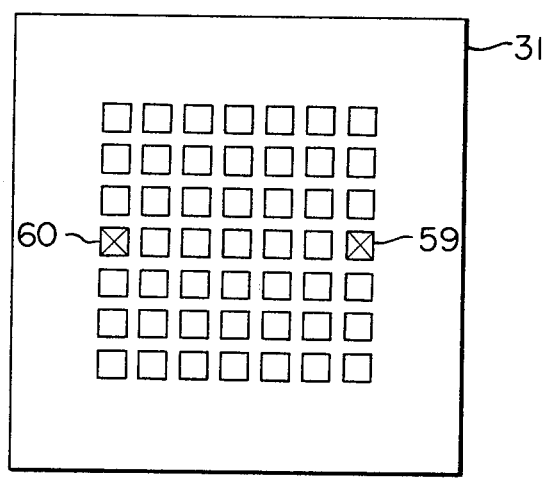
FIG. 8 is a view showing the positions of alignment marks on a mask.
Figure 9:
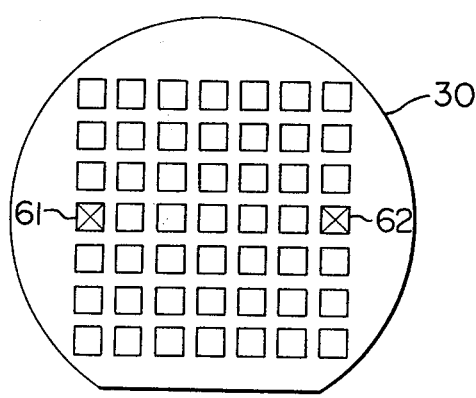
FIG. 9 is a view showing the positions of alignment marks on a wafer.

The optical system described above shows the principle in the case where an alignment mark is provided at one location, but it is also possible to design an optical system in which alignment marks are provided at locations 59 and 60 on the surface of the mask 31 shown in FIG. 8 and at locations 61 and 62 on the surface of the wafer 30 shown in FIG. 9 so that alignment is effected at each of the locations 59 and 61 and at each of the locations 60 and 62.

Figure 7:
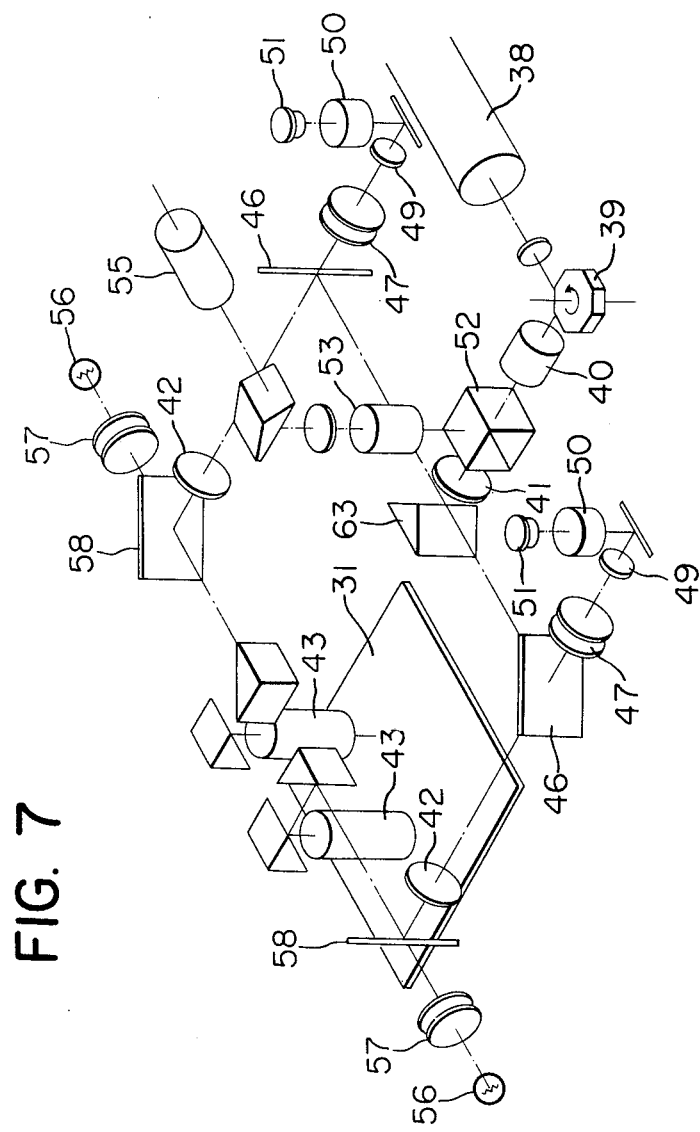
FIG. 7 illustrates the principle of an optical system for providing scanning signals from two locations.

The optical system shown in FIG. 7 is one which uses a single laser source 38 to scan the alignment marks provided at two locations.

Designated by 63 is a view field splitting mirror. Since the light deflected by the rotatable polygon mirror 39 impinges on the reflecting surfaces of the view field splitting mirror 63 at different times, the light is split in time so as to scan two locations. The system after the light has been split is similar to that shown in FIG. 6.

Figure 12:
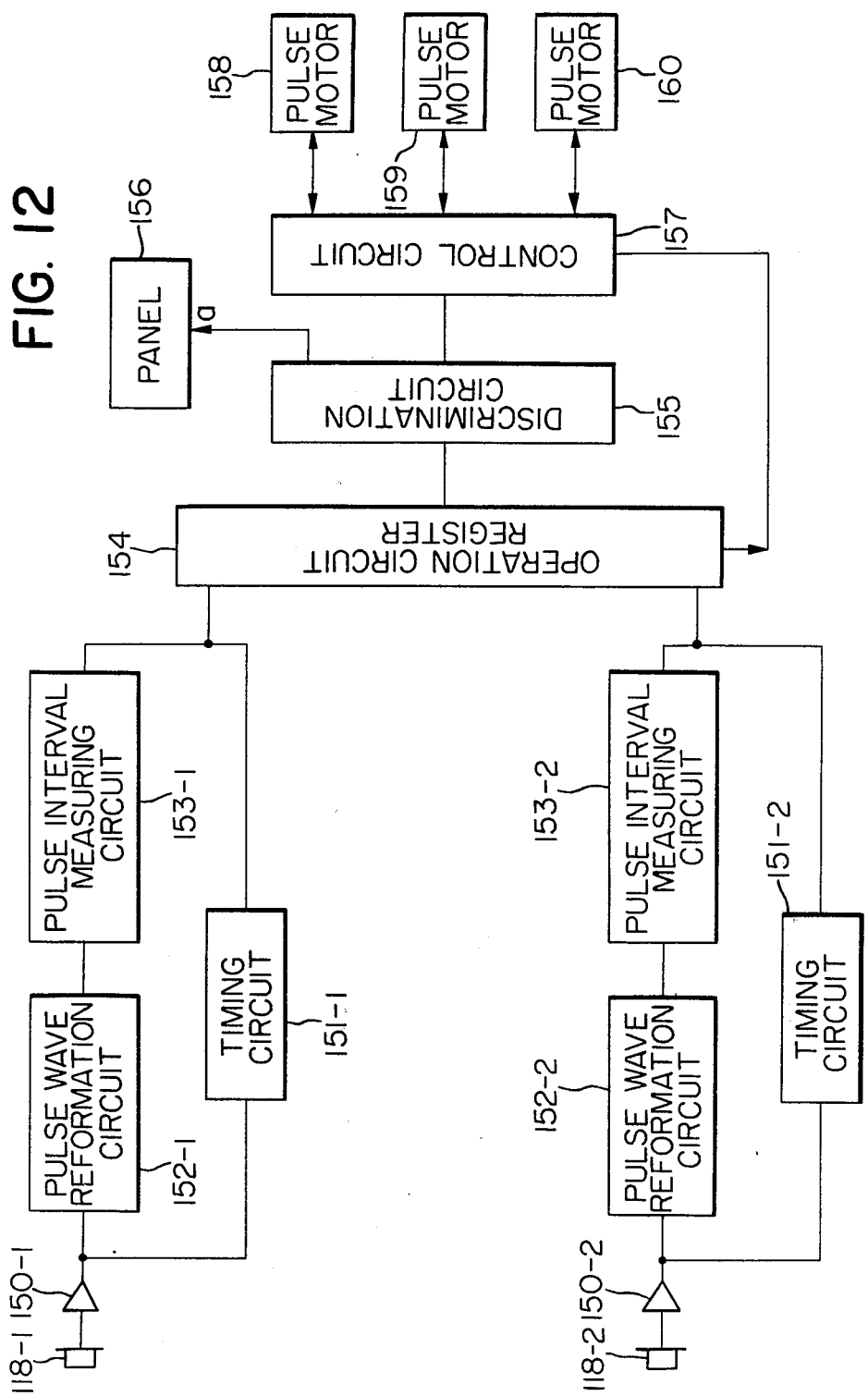
FIG. 12 is a block diagram of an electric processing unit.

FIG. 12 illustrates the principle of the electric system for measuring the amount of deviation from a predetermined positional relation between the mask and the wafer from the scanning signal detected by the photodetector and for controlling the drive of pulse motors for correcting the deviation.

The system includes photodetectors 118-1 and 118-2, preamplifiers 150-1 and 150-2, timing circuits 151-1 and 151-2, pulse wave reformation circuits 152-1 and 152-2, and pulse interval measuring circuits 153-1 and 153-2. These are two sets of circuits for treating the respective scanning signals for alignment marks.

The scanning signals detected by the photodetectors 118 are amplified by the preamplifiers 150 and applied to the timing circuits 151 and the wave reformation circuits 152.

The timing circuits 151 generate timing signals representing the start and end of the measurement and the pulse interval measuring circuits 153 and the circuit 155 are controlled by the timing signals.

The scanning signal is reformed into a pulse signal by the wave reformation circuit 152-1.

Figure 11:
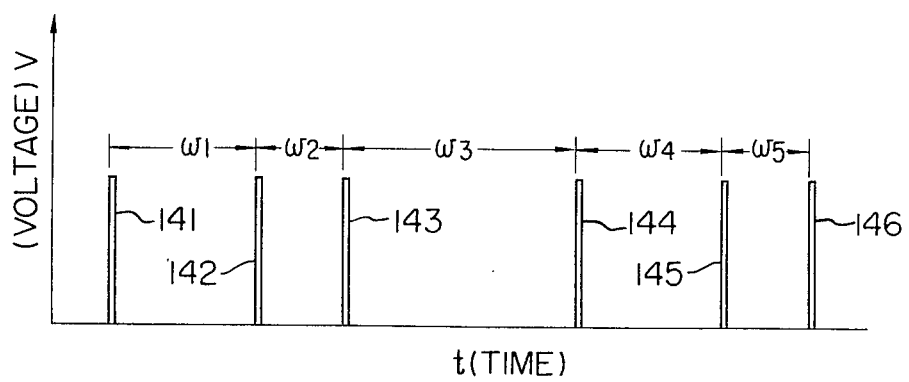
FIG. 11 shows a scanning signal detected from a photodetector.

FIG. 11 shows wave-reformed signals. Numerals 141, 142, 143, 144, 145 and 146 designate signals derived from the points whereat the alignment marks 34, 32, 35, 36, 33 and 37 shown in FIG. 10 intersect the scanning line 70 of the spot light.

$\omega_1$, $\omega_2$, $\omega_3$, $\omega_4$ and $\omega_5$ are the intervals between the pulse signals and measured by the pulse interval measuring circuits 153.

The circuit 154 comprises an operation circuit for calculating the amount of deviation at the positions of the respective alignment marks and the amount driven by the pulse motor from the pulse intervals measured by the pulse interval measuring circuits 153-1 and 153-2, and a register for storing the result of the calculation.

For example, if alignment has been accomplished completely (the amount of deviation between the standard point of the mask and the reference point of the wafer is zero) when the alignment marks 32 and 33 on the wafer lie at a position which bisects the distance between the alignment marks 34 and 35 and between the alignment marks 36 and 37 on the mask, the relations between the amount of deviation with the alignment marks on the mask as the reference and the pulse intervals are given by the following equations:

$$\Delta x = \tfrac{1}{4}(\omega_1 - \omega_2 + \omega_4 - \omega_5) \tag{5}$$

$$\Delta y = \tfrac{1}{4}(-\omega_1 + \omega_2 + \omega_4 - \omega_5) \tag{6}$$

where $\Delta x$ is the amount of deviation in the direction of x-axis, namely, the amount of deviation of the reference point in the direction x with respect to the mask standard point, and $\Delta y$ is the amount of deviation in the direction of y-axis, namely, the amount of deviation of the reference point in the direction y with respect to the mask standard point.

Also, the amounts driven by the pulse motors are given as follows:

$$X = -\tfrac{1}{2}(\Delta x_1 + \Delta x_2) \tag{7}$$
$$Y = -\tfrac{1}{2}(\Delta y_1 + \Delta y_2) \tag{8}$$

$$\textcircled{H} = -\tfrac{1}{D}(\Delta y_1 - \Delta y_2) \tag{9}$$

where $\Delta x_1$, $\Delta x_2$, $\Delta y_1$ and $\Delta y_2$ are the amounts of deviation measured at the positions of the respective alignment marks, D is the interval between the alignment marks, and X, Y and $\textcircled{H}$ are the amounts driven in the direction of x-axis, the direction of y-axis and the direction of rotation by the pulse motors.

Figure 13:
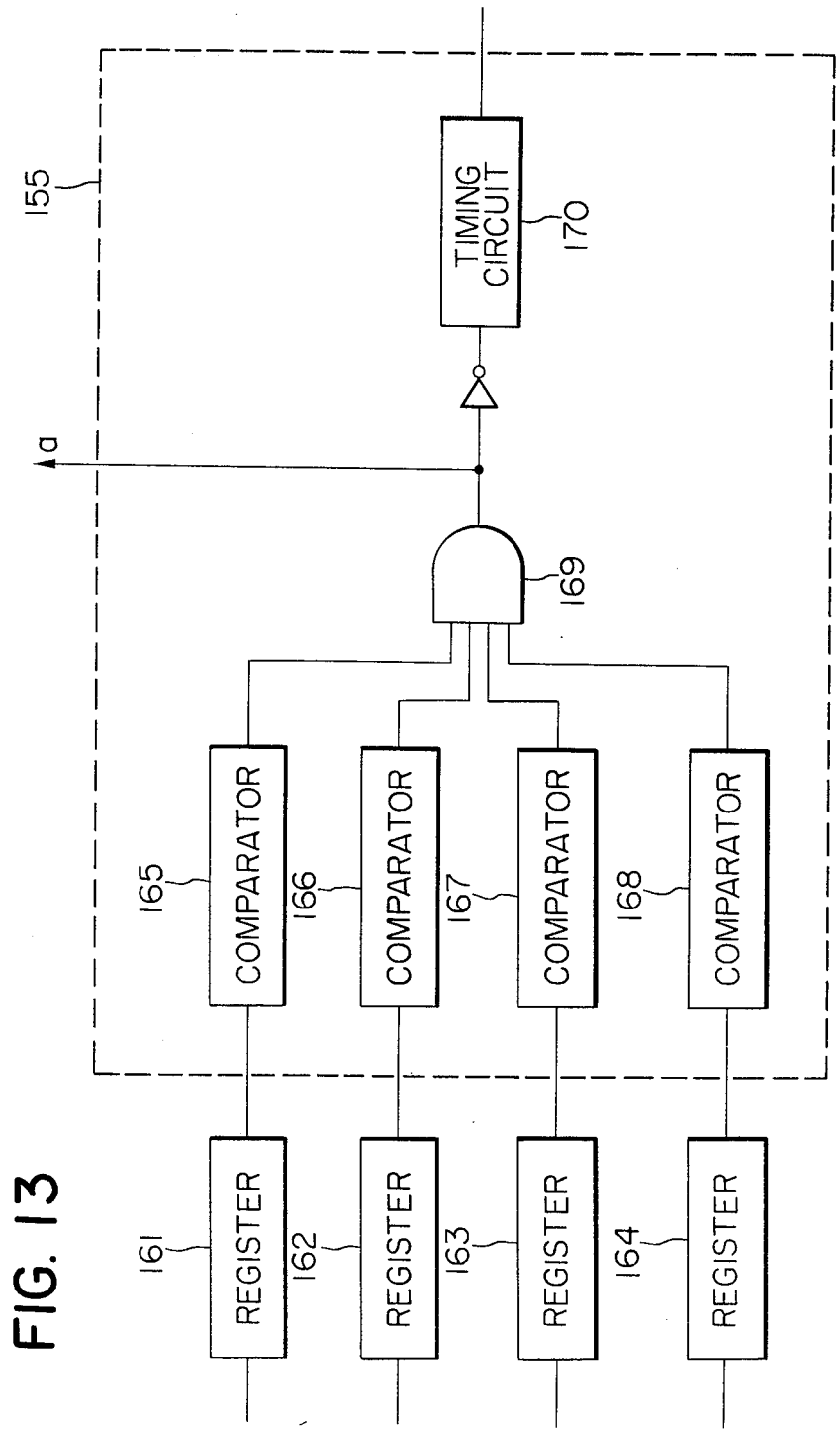
FIG. 13 shows a discrimination circuit.

A discrimination circuit 155 is a circuit for discriminating whether the magnitude of the deviation calculated by the operation circuit is within an allowable value or not, and the details thereof are shown in FIG. 13.

In FIG. 13, registers 161, 162, 163 and 164 have stored therein the values of $|\Delta x_1 + \Delta y_1|$, $|\Delta x_1 - \Delta y_1|$, $|\Delta x_2 + \Delta y_2|$ and $|\Delta x_2 - \Delta y_2|$, respectively.

Designated by 165, 166 and 167 are comparators which produce positive signals when the following relations are satisfied:

$$|\Delta x_1 + \Delta y_1| \leq T \tag{10}$$

$$|\Delta x_1 - \Delta y_1| \leq T \tag{11}$$

$$|\Delta x_2 + \Delta y_2| \leq T \tag{12}$$

$$|\Delta x_2 - \Delta y_2| \leq T \tag{13}$$

where T is a value allowing the amounts of deviation in the directions x and y with the mask standard point as the origin.

Designated by 169 is a four-input AND circuit.

The output of the AND circuit 169 puts out a positive signal when all the relations (10) to (13) are satisfied and this signal provides a signal for turning on a lamp provided on the panel of the apparatus. The turn-on of this lamp indicates to the operator that the mask and wafer have been properly aligned.

A timing circuit 170 produces a timing signal for the circuit 157 which controls the pulse motors.

The control circuit 157 controls the speeds, the amounts of feed and the starting time of the pulse motors 158, 159 and 160 for moving the wafer in the directions of x-axis, y-axis and $\theta$ by the amounts of x, y and $\textcircled{H}$, respectively, calculated by the operation circuit 154.

While the foregoing description has been made on the premise that the interval between the alignment marks on the wafer is invariable, such interval is variable with the error of the manufacture, temperature variations, etc. The variation pitch error is present, it is considered to enlarge the area of the tolerance region in accordance with the pitch error. However, this method is not desirable because it greatly alters the amount of allowable error.

Description will hereinafter be made of an embodiment which covers the pitch error which is described in copending application Ser. No. 16,165.

FIG. 14 illustrates the process in which the amount of deviation is calculated and whether the value thereof is within an allowable value or not is discriminated.

The circuit 200 calculates the amount of deviation according to equations (5) and (6) from the pulse interval.

The circuit 201 calculates the pitch error $$Ep = \tfrac{1}{2}(\Delta x_1 - \Delta x_2) \tag{14}$$

from the amount of deviation.

The circuit 202 discriminates whether or not the pitch error Ep is within a predetermined allowable value.

The circuit 203 determines whether or not the operator allows a change in the allowance by the pitch error Ep and when the change is not allowed, clears the register 204 which has stored therein the pitch error Ep.

The circuit 205 effects the operations of the following formulas (15) to (18):

$$|\Delta x_1 - Ep + \Delta y_1| \tag{15}$$

$$|\Delta x_1 - Ep - \Delta y_1| \tag{16}$$

$$|\Delta x_2 + Ep + \Delta y_2| \tag{17}$$

$$|\Delta x_2 + Ep - \Delta y_2| \tag{18}$$

The circuit 206 discriminates whether or not all the values of formulas (15) to (18) are within allowable values.

The circuit 207 indicates that alignment is not possible because the pitch error exceeds the allowable value thereof.

The circuit 208 indicates termination of alignment.

The circuit 209 indicates it to the circuit for driving the pulse motors that the alignment is incomplete.

The circuit for carrying out the flow chart of FIG. 14 will now be described by reference to FIG. 15.

The signal processing portion for measuring the pulse interval from the scanning signal detected by the photodetector is identical to that of the previous embodiment.

In the present embodiment, the operation circuit 154 calculates the amounts of deviation $\Delta x_1$, $\Delta y_1$, $\Delta x_2$ and $\Delta y_2$ at the positions whereat respective alignment marks are provided, the amounts X, Y and Ⓗ driven by the pulse mortors, the pitch error Ep and the value of its magnitude $|Ep|$, whereafter the value of the pitch error $|Ep|$ is stored in the register 210 and the value of the pitch error Ep is stored in the register 211.

Designated by 212 is a comparator which puts out a positive signal when the pitch error $|Ep|$ is below the allowable value.

By the output signal C of an inverter 216, it is indicated on a panel 156 that alignment is not possible because the pitch error is greater than its allowable value. Whether or not a change is allowed in the tolerance of the error resulting from the pitch error is applied as a signal b by the operator through a switch on the panel.

When a change is not allowed in the tolerance, the signal b is a positive signal, and the output of the AND circuit 215 is a positive signal only when the pitch error is within its allowable value and no change is allowed in the tolerance, thereby clearing the content of the resister in which the pitch error Ep is stored.

Designated by 214 is a timing circuit for producing the timing signal for the operation circuit 217. The operation circuit 217 calculates the formulas (15), (16), (17), and (18) from the amounts of deviation $\Delta x_1$, $\Delta y_1$, $\Delta x_2$ and $\Delta y_2$ calculated by the operation circuit 154 and from the value of the register 211, and causes the respective values to be stored in the registers 61, 62, 63 and 64 shown in FIG. 13.

The comparator 155, the pulse motor control circuit 157 and the pulse motors 158, 159 and 160 are similar to conventional ones.

The comparator 155 determines whether or not the following relations are satisfied:

$$|\Delta x_1 - Ep + \Delta y_1| \leq T' \tag{19}$$

$$|\Delta x_1 - Ep - \Delta y_1| \leq T' \tag{20}$$

$$|\Delta x_2 + Ep + \Delta y_2| \leq T' \tag{21}$$

$$|\Delta x_2 + Ep - \Delta y_2| \leq T' \tag{22}$$

The pulse motor control circuit 157 controls the speeds, the amounts of feed and the starting time of the pulse motors 158, 159 and 160 for moving the wafer in the directions of x-axis, y-axis and Ⓗ by the amounts X, Y and Ⓗ calculated by the operation circuit 154.

What we claim is:

1. An alignment apparatus comprising a first support member for supporting a pattern bearing member provided with first and second alignment marks representing first and second standard points, respectively, along a first standard line, a second support member for supporting a workpiece provided with first and second alignment marks, along a second standard line, representing first and second reference points respectively, corresponding to said standard points, a member for moving at least one of said first and second support members relative to the other, means for photoelectrically scanning said alignment marks on said pattern bearing member and workpiece, and a driving member for operating said moving member to align said pattern bearing member and the workpieces by placing the first standard point within a first tolerable region and placing the second standard point within a second tolerance region, the first tolerable region being defined by an area enclosed with substantially linear lines connecting a first limit point to a third limit point, the third limit point to a second limit point, the second limit point to a fourth limit point, and the fourth limit point to the first limit point, wherein the first and second limit points represent tolerable limits in the direction of the second standard line adjacent to the first reference point, and the third and fourth points represent tolerable limits in a direction of a line perpendicularly crossing the first reference point, the second tolerable region being defined by an area enclosed with substantially linear lines connecting a fifth limit point to a seventh limit point, the seventh limit point to a sixth limit point, the sixth limit point to an eighth limit point, and the eighth limit point to the fifth limit point, wherein the fifth and sixth limit points represent tolerable limits in the direction of the second standard line adjacent to the second reference point, and the seventh and eighth points represent tolerable limits in a direction of a line perpendicularly crossing the second reference point.

* * * * *

UNITED STATES PATENT AND TRADEMARK OFFICE
CERTIFICATE OF CORRECTION

PATENT NO. : 4,278,893
DATED : July 14, 1981
INVENTOR(S) : YUZO KATO, ET AL.

It is certified that error appears in the above—identified patent and that said Letters Patent is hereby corrected as shown below:

In the headnote, item [30], "53-2164" should be --53-21764--.

Column 1, line 67, after "wafer", "1" should be --2--.

Column 6, line 52, after "variation", insert --in such interval is called the pitch error. When such--

Signed and Sealed this

Twenty-second Day of September 1981

[SEAL]

Attest:

*Attesting Officer*

GERALD J. MOSSINGHOFF

*Commissioner of Patents and Trademarks*